United States Patent
Xu et al.

(10) Patent No.: US 12,191,929 B2
(45) Date of Patent: Jan. 7, 2025

(54) DELAY DEVICE AND CONTROL METHOD OF TRANSMISSION DELAY

(71) Applicant: Montage Technology (Kunshan) Co., Ltd., Suzhou (CN)

(72) Inventors: Wenlin Xu, Suzhou (CN); Lixin Jiang, Suzhou (CN)

(73) Assignee: Montage Technology (Kunshan) Co., Ltd., Suzhou (CN)

( * ) Notice: Subject to any disclaimer, the term of this patent is extended or adjusted under 35 U.S.C. 154(b) by 0 days.

(21) Appl. No.: 18/269,964

(22) PCT Filed: May 27, 2022

(86) PCT No.: PCT/CN2022/095725
§ 371 (c)(1),
(2) Date: Jun. 28, 2023

(87) PCT Pub. No.: WO2023/273746
PCT Pub. Date: Jan. 5, 2023

(65) Prior Publication Data
US 2024/0072843 A1    Feb. 29, 2024

(30) Foreign Application Priority Data
Jun. 29, 2021  (CN) .......................... 202110726686.2

(51) Int. Cl.
*H04B 3/20*     (2006.01)
(52) U.S. Cl.
CPC ...................... *H04B 3/20* (2013.01)
(58) Field of Classification Search
CPC .................................. H04B 3/20; H03K 5/134
(Continued)

(56) References Cited

U.S. PATENT DOCUMENTS 10,339,986 B1 *   7/2019   Wu ...................... G11C 7/1057
2003/0057449 A1 * 3/2003   Hirabayashi .......... H03L 7/0995
                                                              257/200
(Continued)

FOREIGN PATENT DOCUMENTS

CN     103532546     1/2014
CN     111245405     6/2020

OTHER PUBLICATIONS

"International Search Report (Form PCT/ISA/210) of PCT/CN2022/095725," mailed on Jul. 27, 2022, with English translation thereof, pp. 1-4.

(Continued)

*Primary Examiner* — Emmanuel Bayard
(74) *Attorney, Agent, or Firm* — JCIPRNET

(57) ABSTRACT

A delay device and a control method of transmission delay capable of performing temperature compensation are provided. The delay device includes a first current source, a second current source, a first resistor, and a delay adjustment circuit. The first current source is configured to provide a first current with a constant temperature coefficient. The second current source is connected to the first current source in parallel and is configured to provide a second current with a negative temperature coefficient. A first terminal of the first resistor is coupled to the first current source and the second current source. A second terminal of the first resistor is coupled to a reference ground terminal. The first resistor generates a control voltage at the first terminal of the first resistor according to the first current and the second current. The delay adjustment circuit is coupled to a transmission wire. The delay adjustment circuit determines a signal transmission delay of the transmission wire according to the control voltage.

14 Claims, 3 Drawing Sheets

(58) Field of Classification Search
USPC .................................................. 375/256–259
See application file for complete search history.

(56) References Cited

U.S. PATENT DOCUMENTS

| | | | | |
|---|---|---|---|---|
| 2003/0218510 | A1* | 11/2003 | Hwang | H03K 3/011 |
| | | | | 331/57 |
| 2012/0062301 | A1* | 3/2012 | Noguchi | H03K 5/133 |
| | | | | 327/288 |
| 2016/0020758 | A1 | 1/2016 | Kim | |
| 2020/0241331 | A1* | 7/2020 | Tatsumi | H03F 3/68 |
| 2020/0328733 | A1 | 10/2020 | Zou | |

OTHER PUBLICATIONS

"Written Opinion of the International Searching Authority (Form PCT/ISA/237) of PCT/CN2022/095725," mailed on Jul. 27, 2022, pp. 1-4.

* cited by examiner

DELAY DEVICE AND CONTROL METHOD OF TRANSMISSION DELAY

CROSS-REFERENCE TO RELATED APPLICATION

This application is a 371 of international application of PCT application serial no. PCT/CN2022/095725, filed on May 27, 2022, which claims the priority benefit of China application no. 202110726686.2, filed on Jun. 29, 2021. The entirety of each of the above mentioned patent applications is hereby incorporated by reference herein and made a part of this specification.

TECHNICAL FIELD

The disclosure relates to a delay device and a control method of transmission delay, in particular, relates to a delay device and a control method of transmission delay capable of performing temperature compensation.

DESCRIPTION OF RELATED ART

With the advancement of electronic technology, the design of integrated circuits has become an important key technology. In circuit design, it is often necessary to control the transmission delay on a transmission wire, for example, in the design of the clock tree. In the known technical field, a number of methods of adjusting the transmission delay on a transmission wire are available. However, when the ambient temperature changes, based on the temperature coefficient of the circuit components, the transmission delay generated on the transmission wire may change accordingly, and the performance of the circuit may thus be lowered.

SUMMARY

The disclosure provides a delay device and a control method of transmission delay through which the signal transmission delay of a transmission wire is not affected by changes in ambient temperature.

According to an embodiment of the disclosure, a delay device includes a first current source, a second current source, a first resistor, and a delay adjustment circuit. The first current source is configured to provide a first current with a constant temperature coefficient. The second current source is connected to the first current source in parallel and is configured to provide a second current with a negative temperature coefficient. A first terminal of the first resistor is coupled to the first current source and the second current source. A second terminal of the first resistor is coupled to a reference ground terminal. The first resistor generates a control voltage at the first terminal of the first resistor according to the first current and the second current. The delay adjustment circuit is coupled to a transmission wire. The delay adjustment circuit determines a signal transmission delay of the transmission wire according to the control voltage.

According to an embodiment of the disclosure, a control method of transmission delay includes the following steps. A first current with a constant temperature coefficient is provided. A second current with a negative temperature coefficient is provided. The first current and the second current are allowed to flow through a resistor, a control voltage is generated on a terminal of the resistor receiving the first current and the second current. A signal transmission delay of a transmission wire is determined according to the control voltage.

According to the above, in the disclosure, the control voltage is generated by allowing the second current having a negative temperature coefficient to flow through the first resistor. In this way, according to the control voltage, the delay adjustment circuit for providing the signal transmission delay can provide the signal transmission delay independent of the influence of the ambient temperature, and the correctness of the delay is maintained.

BRIEF DESCRIPTION OF THE DRAWINGS

The accompanying drawings are included to provide a further understanding of the disclosure, and the accompanying drawings are incorporated in and constitute a part of this specification. The drawings illustrate the embodiments of the disclosure, and together with the description, serve to explain the principle of the disclosure.

DESCRIPTION OF THE EMBODIMENTS

In the following detailed description, reference is made to the accompanying drawings which form a part hereof. In the accompanying drawings, similar symbols generally denote similar components, unless context dictates otherwise.

Figure 1:
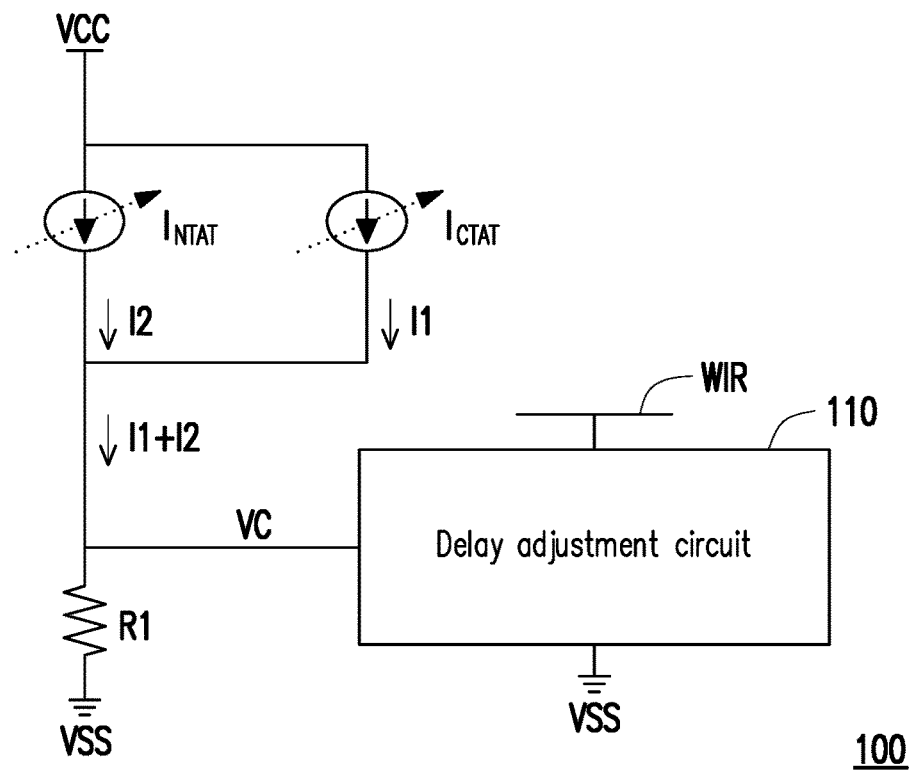
FIG. 1 is a schematic diagram of a delay device according to an embodiment of the disclosure.

With reference to FIG. 1, FIG. 1 is a schematic diagram of a delay device according to the present embodiment. A delay device 100 includes current sources $I_{CTAT}$ and $I_{NTAT}$, a resistor R1, and a delay adjustment circuit 110. The current source $I_{CTAT}$ receives a power supply voltage VCC and is configured to provide a current I1, and the current I1 has a constant temperature coefficient. That is, a magnitude of the current I1 does not change along with an ambient temperature. The current source $I_{NTAT}$ also receives the power supply voltage VCC and is coupled to the current source $I_{CTAT}$ in parallel. The current source $I_{NTAT}$ is configured to provide a current I2, where the current I2 has a negative temperature coefficient. That is, the current I2 decreases as the ambient temperature rises and increases as the ambient temperature drops. The resistor R1 is coupled between the current source $I_{NTAT}$ and current source $I_{CTAT}$ and a reference ground voltage VSS. A first terminal of the resistor R1 receives the current I1 and the current I2 and generates a control voltage VC according to the current I1 and the current I2. A second terminal of the resistor R1 receives the reference ground voltage VSS, and the reference ground voltage VSS may have a voltage value of 0V.

The delay adjustment circuit 110 is coupled to a transmission wire WIR and to the first terminal of the resistor R1. The delay adjustment circuit 110 receives the control voltage VC on the first terminal of the resistor R1 and determines the signal transmission delay on the transmission wire WIR according to the control voltage VC.

In detail, based on the fact that the current I1 has a constant temperature coefficient and the current I2 has a negative temperature coefficient, the currents I1 and I2 received by the resistor R1 may be correlated with changes in ambient temperature. The control voltage VC=R1×(I1+ I2), and when the ambient temperature changes (the change of ambient temperature is represented by $\Delta T$), the control voltage VC may be a function of the temperature change $\Delta T$, where VC ($\Delta T$)=$\Delta I2 \times R1$.

On the other hand, the delay adjustment circuit 110 may generate an internal current according to the control voltage VC and may determine the signal transmission delay on the transmission wire WIR according to the charging or discharging performed by the internal current. When the ambient temperature changes, the internal current generated by the delay adjustment circuit 110 and the charging and discharging mechanism of the internal current may also be affected. In this embodiment, by adjusting the generated control voltage VC according to changes in ambient temperature, the signal transmission delay of the transmission wire WIR provided by the delay adjustment circuit 110 may be compensated, and the signal transmission delay may be made independent of changes of the ambient temperature.

Incidentally, in this embodiment, both the current sources $I_{CTAT}$ and $I_{NTAT}$ may be variable current sources, and the generated currents I1 and I2 may be adjusted according to corresponding current control signals applied to the current sources $I_{CTAT}$ and $I_{NTAT}$, respectively. In some embodiments, the current control signals may be, for example, binary control bits, quaternary control bits, or octal control bits. By adjusting the currents I1 and I2 respectively generated by the current sources $I_{CTAT}$ and $I_{NTAT}$, the control voltage VC may be adjusted, and the delay adjustment circuit 110 may adjust the transmission delay on the transmission wire WIR.

On the other hand, the resistor R1 may also be a variable resistor. The resistor R1, which is a variable resistor, may adjust a provided resistance value according to a control signal. The control signal may be an analog signal or a digital signal. Similarly, by adjusting the resistance value of the resistor R1, the control voltage VC may be adjusted, and the delay adjustment circuit 110 may adjust the transmission delay on the transmission wire WIR.

The variable current sources $I_{CTAT}$ and $I_{NTAT}$ and the variable resistor R1 may be implemented as variable current source circuits and variable resistor circuits known to a person having ordinary skill in the art without specific limitations.

Figure 2:
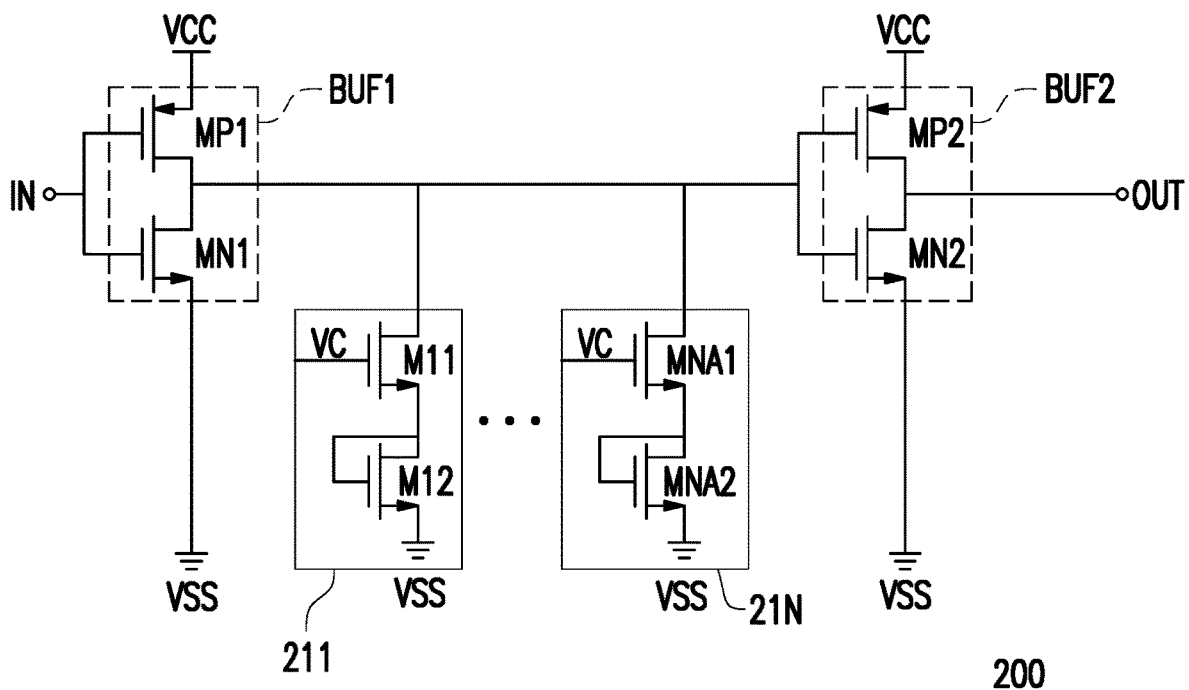
FIG. 2 is a schematic diagram of implementation of a delay adjustment circuit in a delay device according to an embodiment of the disclosure.

With reference to FIG. 2, FIG. 2 is a schematic diagram of implementation of a delay adjustment circuit in a delay device according to an embodiment of the disclosure. A delay adjustment circuit 200 includes a plurality of current-controlled delayers 211 to 21N. The current-controlled delayers 211 to 21N are coupled to the transmission wire WIR. The current-controlled delayer 211 includes transistors M11 and M12, and the current-controlled delayer 21N includes transistors MNA1 and MNA2. Taking the current-controlled delayer 211 as an example, a first terminal of the transistor M11 is coupled to the transmission wire WIR, a second terminal of the transistor M11 is coupled to the transistor M12, and a control terminal of the transistor M11 receives the control voltage VC. The transistor M12 is coupled as a diode, the anode of the diode is coupled to the second terminal of the transistor M11, and the cathode of the diode is coupled to the reference ground voltage VSS.

Taking the current-controlled delayer 211 as an example, the transistor M11 is configured to generate an internal current according to the control voltage. The internal current may perform charging and discharging operations through the diode formed by the transistor M12, and through the charging and discharging operations, the internal current causes a signal transmission delay to be generated on the transmission wire WIR. Therefore, by adjusting the magnitude of the control voltage, the internal circuit may be adjusted, and the signal transmission delay may thus be adjusted.

Incidentally, the transmission wire WIR is coupled between an output terminal of a buffer BUF1 and an input terminal of a buffer BUF2. The buffer BUF1 is formed by transistors MP1 and MN1 and receives an input signal IN. The buffer BUF2 is formed by transistors MP2 and MN2 and generates an output signal OUT.

It is particularly noted that when the ambient temperature changes, the delay device provided by the embodiments of the disclosure can adjust the voltage value of the control voltage VC according to the temperature change and can positively correlate the change of the control voltage VC with the change of the turn-on voltages of the transistor M11 and the transistor M12 according to the ambient temperature. For instance, the change of the control voltage VC and the change of the turn-on voltages of the transistors M11 and M12 may be substantially the same. Under such conditions, when the ambient temperature changes, since the changes of the control voltage VC and the turn-on voltages of the transistors M11 and M12 are the same, the signal transmission delay generated by each of the current control delayers 211 to 21N may not be affected by changes in ambient temperature, and the signal transmission delay is maintained at the original set value.

In this embodiment, the turn-on voltages of the transistors M11 and M12 may have negative temperature coefficients.

In this embodiment, the circuit structure and electrical characteristics of each of the current-controlled delayers 211 to 21N may be the same.

Figure 3:
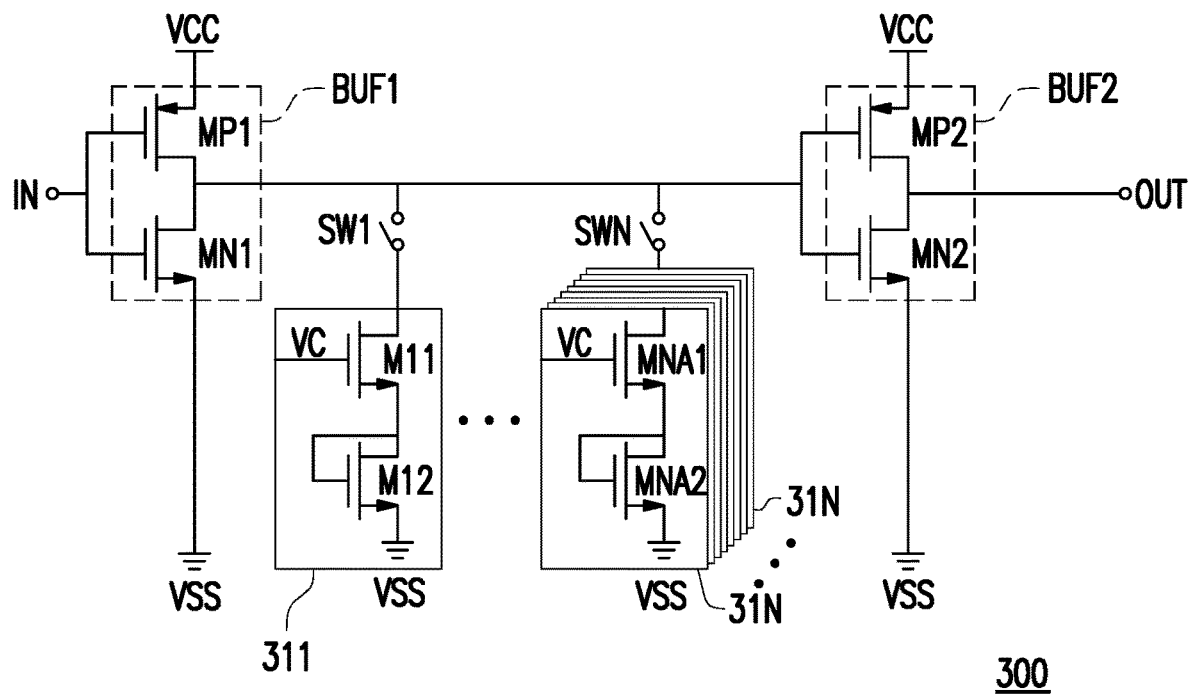
FIG. 3 is a schematic diagram of other implementation of a delay adjustment circuit in a delay device according to an embodiment of the disclosure.

With reference to FIG. 3, FIG. 3 is a schematic diagram of other implementation of a delay adjustment circuit in a delay device according to an embodiment of the disclosure. Different from the embodiment of FIG. 2, a delay adjustment circuit 300 includes a plurality of current-controlled delayers 311 to 31N and a plurality of switches SW1 to SWN. The current-controlled delayers 311 to 31N may be divided into N groups (N is an integer greater than 1). The N groups are coupled to the transmission wire WIR respectively through the N switches SW1 to SWN. Herein, the number of current-controlled delayers in each group is different. In this embodiment, the number of current-controlled delayers in the first group is 1 ($2^0$), and the number of current-controlled delayers in the $N^{th}$ group may be $2^{N-1}$.

The circuit structure and electrical characteristics of each current-controlled delayer may be the same, and the details of its operation may be similar to the current-controlled delayers 211 to 21N in the embodiment of FIG. 2.

In this embodiment, the switches SW1 to SWN are used to control the number of current-controlled delayers actually connected to the transmission wire WIR. Herein, the switches SW1 to SWN can be individually controlled by a plurality of bits of an enable signal, and specifically, one bit of the enable signal can control one switch correspondingly. For instance, the switch SW1 may be controlled by the least significant bit of the enable signal, and switch SWN may be controlled by the most significant bit of the enable signal. In this way, the signal transmission delay of the transmission wire WIR may be digitally adjusted according to the plurality of bits of the enable signal.

In this embodiment, the signal transmission delay of the transmission wire WIR may be coarsely adjusted by adjusting the control voltage VC, and the signal transmission delay of the transmission wire WIR may be finely adjusted by adjusting the number of switches that are turned on.

Figure 4:
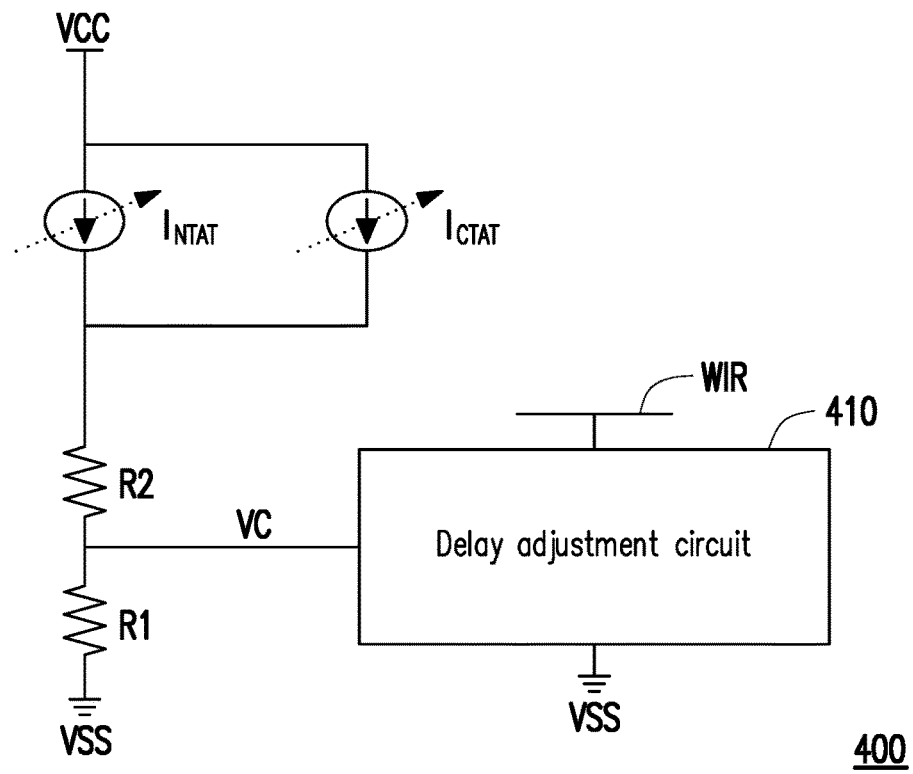
FIG. 4 is a schematic diagram of a delay device according to another embodiment of the disclosure.

With reference to FIG. 4, FIG. 4 is a schematic diagram of a delay device according to another embodiment of the disclosure. A delay device 400 includes current sources $I_{CTAT}$ and $I_{NTAT}$, resistors R1 and R2, and a delay adjustment circuit 410. Different from the embodiment of FIG. 1, the resistor R2 is further provided in this embodiment. The resistor R2 is disposed between the resistor R1 and the coupling terminals of the current sources $I_{CTAT}$ and $I_{NTAT}$.

The delay adjustment circuit 410 may be implemented by applying any of the delay adjustment circuits 210 and 310 in the aforementioned embodiments of FIGS. 2 and 3, and no specific limitation is applied.

Figure 5:
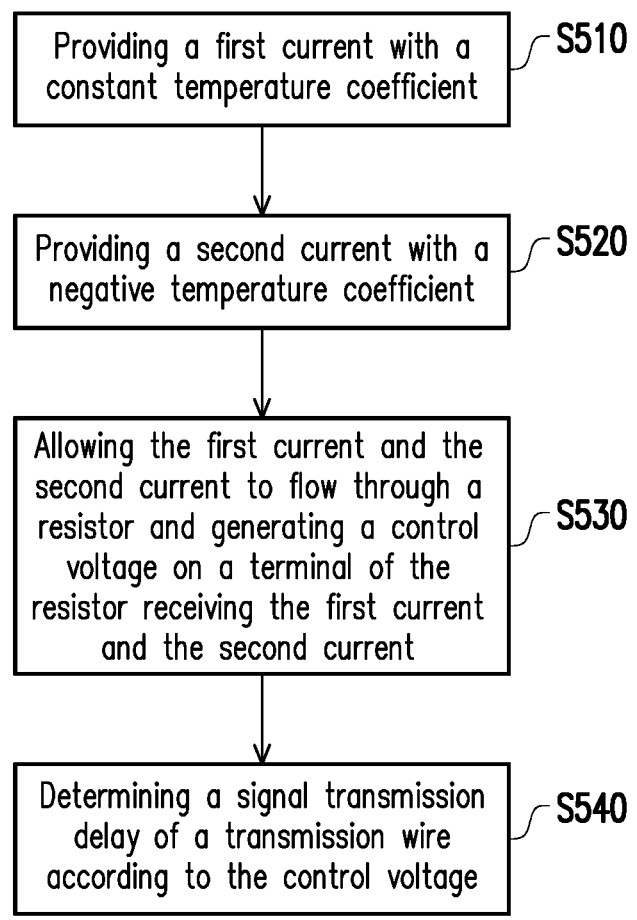
FIG. 5 is a flow chart of a control method of transmission delay according to an embodiment of the disclosure.

With reference to FIG. 5, FIG. 5 is a flow chart of a control method of transmission delay according to an embodiment of the disclosure. In step S510, a first current with a constant temperature coefficient is provided, and in step S520, a second current with a negative temperature coefficient is provided. The first current and the second current may be combined in step S530, and a control voltage is generated on a terminal of a resistor receiving the first current and the second current. The other terminal of the resistor may receive a fixed reference voltage, such as a reference ground voltage. Finally, in step S540, a signal transmission delay of a transmission wire is determined according to the control voltage.

Details of the above steps are described in the foregoing embodiments and implementation, so description thereof is not repeated herein.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the disclosure.

What is claimed is:

1. A delay device, comprising:
   a first current source, providing a first current with a constant temperature coefficient;
   a second current source, connected to the first current source in parallel and providing a second current with a negative temperature coefficient;
   a first resistor, wherein a first terminal of the first resistor is coupled to the first current source and the second current source, a second terminal of the first resistor is coupled to a reference ground terminal, and the first resistor generates a control voltage on the first terminal of the first resistor according to the first current and the second current; and
   a delay adjustment circuit, coupled to a transmission wire and determining a signal transmission delay of the transmission wire according to the control voltage.

2. The delay device according to claim 1, wherein the first current source is a variable current source, and a current value of the first current is adjusted by a current control signal applied to the first current source.

3. The delay device according to claim 1, wherein the second current source is a variable current source, and a current value of the second current is adjusted by a current control signal applied to the second current source.

4. The delay device according to claim 1, further comprising:
   a second resistor, coupled in series between the first current source and the first terminal of the first resistor.

5. The delay device according to claim 1, wherein the first resistor is a variable resistor.

6. The delay device according to claim 1, wherein the delay adjustment circuit comprises a plurality of current-controlled delayers, and the current-controlled delayers adjust the signal transmission delay according to the control voltage.

7. The delay device according to claim 6, wherein each of the current-controlled delayers comprises:
   a first transistor, wherein a first terminal of the first transistor is coupled to the transmission wire, a control terminal of the first transistor receives the control voltage, and the first transistor generates a third current according to the control voltage; and
   a second transistor, coupled between a second terminal of the first transistor and the reference ground terminal, wherein the second transistor is coupled as a diode.

8. The delay device according to claim 7, wherein a change of the control voltage is positively related to changes in turn-on voltages of the first transistor and the second transistor according to the ambient temperature.

9. The delay device according to claim 7, wherein each of the current-controlled delayers charges or discharges the second transistor according to the third current to generate a delay.

10. A control method of transmission delay, comprising:
    providing a first current with a constant temperature coefficient;
    providing a second current with a negative temperature coefficient;
    allowing the first current and the second current to flow through a resistor and generating a control voltage on a terminal of the resistor receiving the first current and the second current; and
    determining a signal transmission delay of a transmission wire according to the control voltage.

11. The control method according to claim 10, further comprising:
    adjusting a current value of the first current according to a corresponding current control signal.

12. The control method according to claim 10, further comprising:
    adjusting a current value of the second current according to a corresponding current control signal.

13. The control method according to claim 10, wherein the step of determining the signal transmission delay of the transmission wire according to the control voltage further comprises:
    providing a first transistor, wherein the first transistor is coupled to the transmission wire;
    allowing the first transistor to generate a third current according to the control voltage; and
    charging or discharging the second transistor according to the third current to generate a delay.

14. The control method according to claim 13, wherein a change of the control voltage is positively related to changes in turn-on voltages of the first transistor and the second transistor according to the ambient temperature.

* * * * *